US011362667B1

(12) United States Patent
Futamura et al.

(10) Patent No.: US 11,362,667 B1
(45) Date of Patent: Jun. 14, 2022

(54) REDUCING DELAY-LOCK LOOP DELAY FLUCTUATION

(71) Applicant: Cypress Semiconductor Corporation, San Jose, CA (US)

(72) Inventors: Kazuyoshi Futamura, Nagoya (JP); Kazuhiro Tomita, Kasugai (JP); Koji Okada, Yokohama (JP); Hiroyuki Matsunami, Tajimi (JP)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 17/485,082

(22) Filed: Sep. 24, 2021

(51) Int. Cl.
*H03L 7/081* (2006.01)
*H03L 7/089* (2006.01)

(52) U.S. Cl.
CPC .......... *H03L 7/0816* (2013.01); *H03L 7/0814* (2013.01); *H03L 7/0891* (2013.01)

(58) Field of Classification Search
CPC .... H03L 7/0816; H03L 7/0814; H03L 7/0891
See application file for complete search history.

(56) References Cited

U.S. PATENT DOCUMENTS

| 7,317,342 | B2* | 1/2008 | Saint-Laurent | H03L 7/0995 327/295 |
| 7,746,135 | B2* | 6/2010 | Schneider | H03L 7/0805 327/158 |
| 7,795,935 | B2* | 9/2010 | Schneider | H03L 7/07 327/158 |
| 8,373,479 | B1* | 2/2013 | Ho | H03L 7/0816 327/158 |
| 10,784,874 | B1* | 9/2020 | Bang | G06F 30/39 |
| 2003/0117194 | A1* | 6/2003 | Lee | H03K 5/1565 327/158 |
| 2006/0193419 | A1* | 8/2006 | Maneatis | H03L 7/0812 375/376 |
| 2007/0096784 | A1* | 5/2007 | Hasegawa | H03L 7/07 327/158 |
| 2010/0296351 | A1* | 11/2010 | Sano | G11C 11/4076 327/158 |
| 2013/0342251 | A1* | 12/2013 | Patel | H03L 7/0816 327/158 |
| 2014/0015573 | A1* | 1/2014 | Ross | H03L 7/0812 327/158 |
| 2015/0003176 | A1* | 1/2015 | Spinks | G06F 1/10 327/158 |
| 2015/0214965 | A1* | 7/2015 | Odedara | H03L 7/0805 327/158 |
| 2017/0237442 | A1* | 8/2017 | Kim | G11C 7/00 327/142 |
| 2018/0048319 | A1* | 2/2018 | Chae | H03L 7/07 |

* cited by examiner

*Primary Examiner* — Adam D Houston

(57) ABSTRACT

A device includes a master delay-lock loop (DLL) having a phase frequency detector connected in series with a charge pump that is to generate a control voltage. A slave DLL is coupled to the master DLL and has a delay line including a buffer to receive a slave clock and a series of delay cells coupled between the buffer and an output terminal that is to output a delay clock, the series of delay cells variably controlled by the control voltage. The master DLL and the slave DLL are powered by a power supply that experiences undershoot or overshoot in response to a load transient. A dummy load is coupled between the delay line of the slave DLL and an output of the power supply, the dummy load including an exclusive OR gate that receives, as inputs, a first output of the buffer and the delay clock.

20 Claims, 12 Drawing Sheets

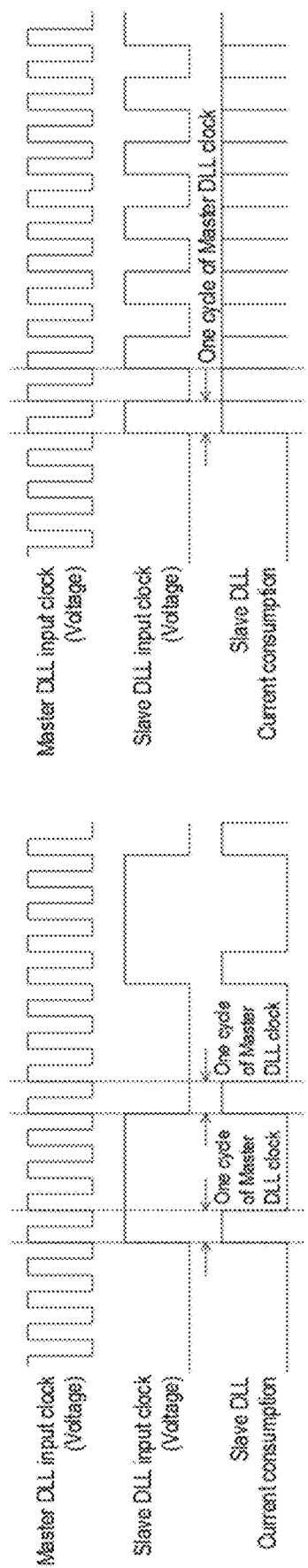
FIG. 2A
FIG. 2B
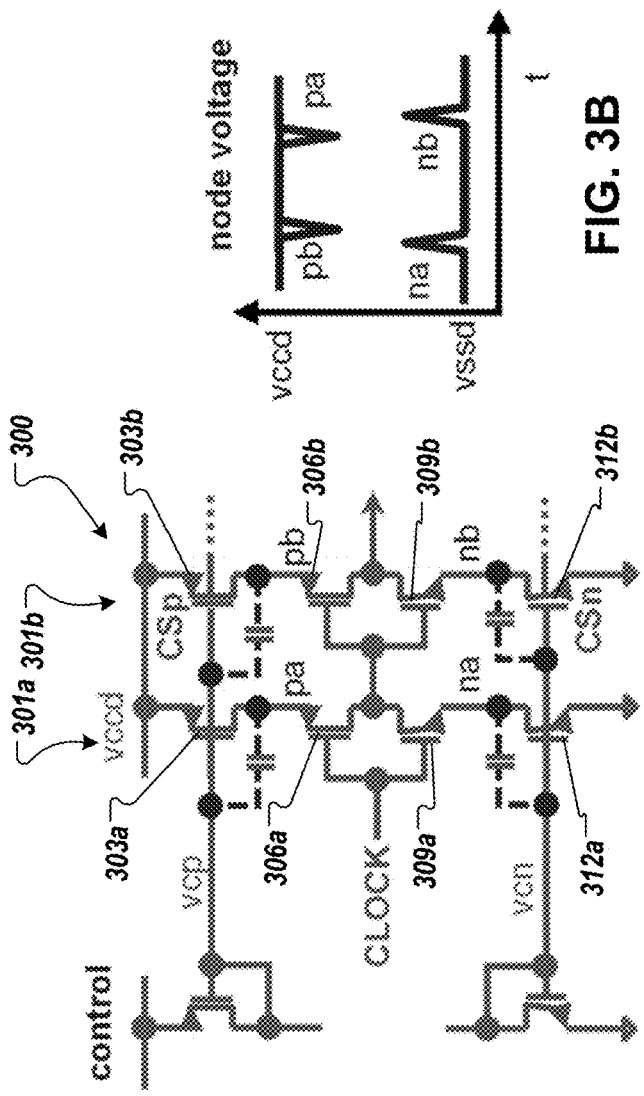
FIG. 3B
FIG. 3A

REDUCING DELAY-LOCK LOOP DELAY FLUCTUATION

BACKGROUND

In electronics, a delay-locked loop (DLL) is a digital circuit similar to a phase-locked loop (PLL), with the main difference being the absence of an internal voltage-controlled oscillator, replaced by a delay line. A DLL can be used to change the phase of a clock signal (e.g., a signal with a periodic waveform), usually to enhance the clock rise-to-data output valid timing characteristics of integrated circuits (such as dynamic random-access memory devices or memory control units, which are growing in use in automobiles). DLLs can also be used for clock recovery (CDR). From the outside, a DLL can be seen as a negative-delay gate placed in the clock path of a digital circuit.

BRIEF DESCRIPTION OF THE DRAWINGS

The disclosure is illustrated by way of example, and not of limitation, in the figures of the accompanying drawings.

FIG. 2A is a set of timing graphs illustrating that a slave DLL can have an eighth of a frequency of a master DLL according to some embodiments.

FIG. 2B is a set of timing graphs illustrating that the slave DLL can have a half of the frequency of the master DLL according to some embodiments.

FIG. 3A is a schematic block diagram of a delay cell according to at least some embodiments.

FIG. 3B is a graph illustrating fluctuations in bias nodes of the delay cell due to capacitive coupling according to some embodiments.

DETAILED DESCRIPTION

The following description sets forth numerous specific details such as examples of specific systems, devices, components, methods, and so forth, in order to provide a good understanding of various embodiments of the techniques described herein for reducing supply voltage deviation and bias voltage deviation in delay lock loop (DLL) cells, which occur when a slave DLL starts or stops operation within a DLL system or DLL device. It will be apparent to one skilled in the art, however, that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implement-ations may vary from these exemplary details and still be contemplated to be within the scope of the present disclosure.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the disclosure. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Figure 1:
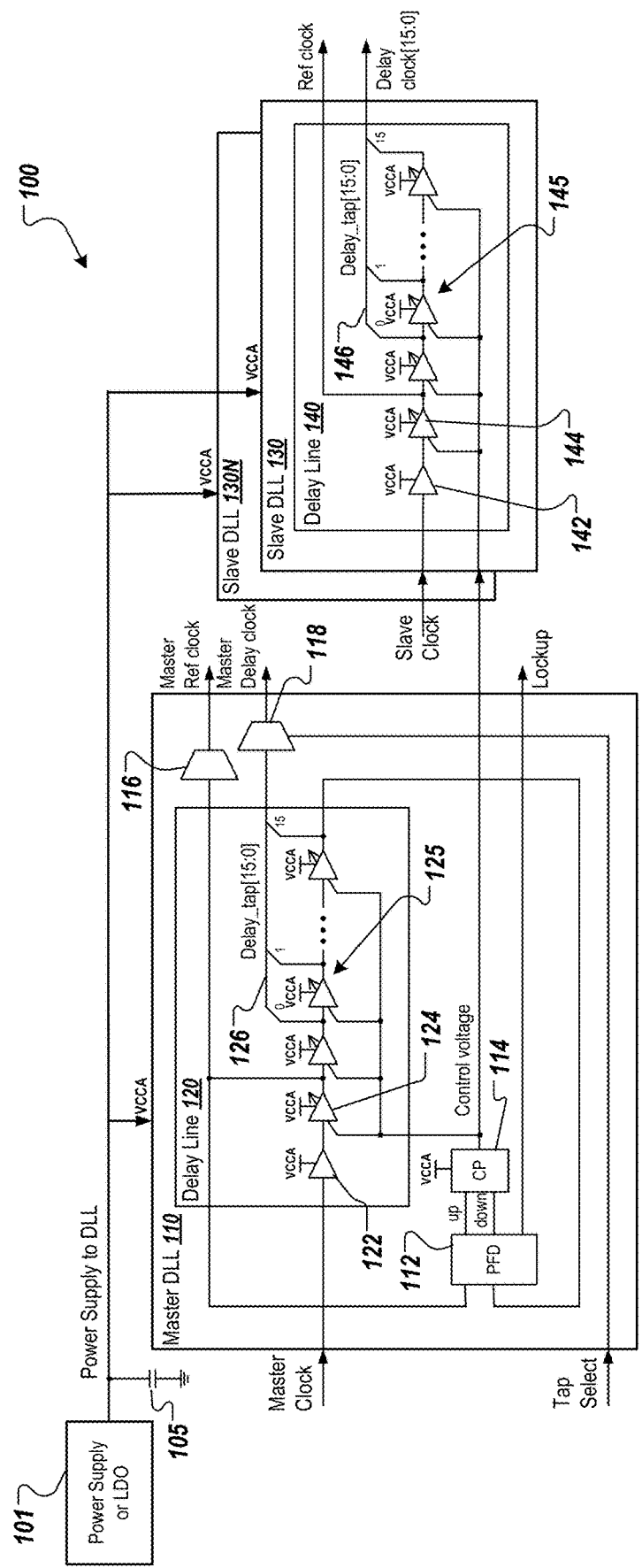
FIG. 1 is a schematic block diagram of a delay lock loop (DLL) system according to at least some embodiments.

FIG. 1 is a schematic block diagram of a delay lock loop (DLL) system 100 according to at least some embodiments. In these embodiments, the DLL system includes a power supply 101 that experiences one of undershoot or overshoot in response to a load transient. In one embodiment, the power supply 101 is a low-dropout regulator (LDO). A capacitor 105 is coupled to an output of the power supply that has been conventionally made large to smooth the power supply voltage output. In these embodiments, the DLL system 100 further includes a master DLL 110 to generate clock references and a control voltage that selectively controls delay cells. The DLL system 100 can further include one or more slave DLLs 130 to 130N. The power supply 101 can power both the master DLL 110 and the one or more slave DLLs 130 to 130N, as indicated by the VCCA inputs.

In at least some embodiments, the master DLL 110 includes a charge pump 114 to generate the control voltage, a phase frequency detector 112 connected to an input of the charge pump 114, and a master delay line 120. The phase frequency detector 112 can, for example, provide detected up and down signals to the charge pump 114, which causes the charge pump to generate the control voltage for a particular phase in clock outputs. The master delay line 120 can further include a buffer 122 to receive the master clock and a series of delay cells 125 coupled between the buffer 122 and an output terminal of the master delay line 120. In some embodiments, a dummy delay buffer 124 is connected in series between the buffer 122 and the series of delay cells 125. In some embodiments, the series of delay cells 125 can be implemented as buffers in temporarily storing a delayed clock, e.g., a clock of shifted phase. The output of the series of delay cells 125 can be fed back into the phase frequency detector 112, as illustrated. In these embodiments, the control voltage can be supplied to the dummy delay buffer 124 and to each delay cell of the series of delay cells 125.

In at least some embodiments, the DLL system 100 further includes a multiplexer 116 that selects a master reference clock as an output from the phase frequency detector 112 and an output of the dummy delay buffer 124. The DLL system 100 can further include a multiplexer 118 that receives a tap select signal to select one of a series of delay taps from a delay tap line 126 that is connected to the outputs of the series of delay cells 125. In this way, the multiplexer 118 can output a selected master delay clock. Although the number of taps of the delay tap line 126 is illustrated at 16, fewer or more taps can be employed.

In various embodiments, a slave DLL 130 of the one or more slave DLLs 130 to 130N includes a slave delay line 140. The slave delay line can, in turn, include a buffer 142 to receive a slave clock and a series of delay cells 145 coupled between the buffer 142 and an output terminal. In some embodiments, a dummy delay buffer 144 is connected in series between the buffer 142 and the series of delay cells 125. An output of the dummy delay buffer 144 can provide a reference clock. In some embodiments, the series of delay cells 145 is implemented as buffers in temporarily storing a delayed clock. The output terminal outputs a delay clock (e.g., delay clock[15:0]), which may be selected from a delay tap line 146 that is connected to outputs of the series of delay cells 145. This delay clock can include a particular shift in phase compared to the slave clock. Although the number of taps of the delay tap line 146 is illustrated at 16, fewer or more taps can be employed. In these embodiments, the control voltage output from the charge pump 114 is supplied to the dummy delay buffer 144 and to each delay cell of the series of delay cells 145.

In at least some embodiments, when the slave DLL 130 is enabled or starts operating, the supply current from the power supply 101 to the slave DLL 130 (e.g., VCCA) increases. In some DLL systems, the power supply output voltage experiences an undershoot (or an overshoot) that causes delay fluctuation of the output delay clocks of both the master DLL 110 and the slave DLL 130. Similarly, when the slave DLL 130 is disabled or stops operating, the supply current from the power supply 101 decreases. In some DLL systems, the power supply output experiences an undershoot (or overshoot) that causes delay fluctuation of the output delay clocks of both the master DLL 110 and the slave DLL 130. Using the capacitor 105 alone is insufficient to resolve delay fluctuation and, as a partial solution, incurs much circuit space to be sufficiently large, thus requiring additional power and cost as a stand-alone solution.

FIG. 2A is a set of timing graphs illustrating that the slave DLL 130 can have an eighth of a frequency of the master DLL 110 according to some embodiments. In these embodiments, the slave DLL 130 consumes current from the power supply 101 during this eighth of the clock cycle of the master DLL 110. FIG. 2B is a set of timing graphs illustrating that the slave DLL can have a half of the frequency of the master DLL according to some embodiments. In these embodiments, the slave DLL 130 consumes current from the power supply 101 during this half of the clock cycle of the master DLL 110. The larger the percentage of a cycle of the master DLL input clock during which the slave DLL 130 consumes current, the greater the time during which the above reference delay fluctuation can occur. At least some of the solutions illustrated throughout the various Figures herein minimizes this delay fluctuation due to the slave DLL 130 consuming power supply current, e.g., supply voltage deviation.

FIG. 3A is a schematic block diagram of a delay cell 300 according to at least some embodiments. The delay cell 300 may be considered representative of at least a portion of a delay cell of the series of the delay cells 125 of the master delay line 120 or of the series of delay cells 145 of the slave delay line 140. In some embodiments, the delay cell 300 includes a set of two variable delay inverters 301a and 301b, connected in series. In one embodiment, this set of two variable delay inverters 301a and 301b include of a set of p-type field-effect transistors (pFETs) connected to a set of n-type FETs (nFETs), although other types of transistors can also be used, such as metal-oxide-semiconductor field-effect transistors (MOSFETs) or the like.

More specifically, in at least some embodiments, the set of pFETs of the delay cell 300 include a first pFET 303a and a second pFET 303b having mutually-connected gates and sources coupled to the power supply 101 and a third pFET 306a and a fourth pFET 306b having sources connected to the drains of the first pFET 303a and the second pFET 303b, respectively. In these embodiments, the set of nFETs of the delay cell 300 include a first nFET 309a and a second nFET 309b having drains connected to drains of the third pFET 306a and the fourth pFET 306b, respectively, and a third nFET 312a and a fourth nFET 312b having mutually-connected gates and drains connected to sources of the first nFET 309a and the second nFET 309b, respectively. Sources of the third nFET 312a and the fourth nFET 312b are further coupled to ground.

In these embodiments, gates of the third pFET 306a and the first nFET 309a are mutually-connected to an input clock, and gates of the fourth pFET 306b and the second nFET 309b are mutually-connected to the drains of the third pFET 306a and of the first nFET 309a. Thus, an output of the delay cell 300 can be provided at the drains of the fourth pFET 306b and the second nFET 309b.

In various embodiments, the delay cell 300 receives a positive control voltage (Vcp) at the gates of the first pFET 303a and the second pFET 303b and receives a negative control voltage (Vcn) at the gates of the third nFET 312a and the fourth nFET 312b. There generally exists, as illustrated, a parasitic capacitance at the bias voltage nodes "pa" and "pb" of the set of pFETs and at bias voltage nodes "na" and "nb" of the set of nFETs. Because these parasitic capacitances are coupled to the control voltages, Vcp and Vcn, respectively, control voltages Vcp and Vcn (also referred to a bias voltages herein) incur fluctuations due to the slave delay line 140 toggling on and off. For example, the DC voltage change of bias voltages Vcp and Vcn gradually settle to target bias voltages with a time constant due to capacitive coupling. These fluctuations in the delay cells of the slave delay line 140 directly causes corresponding fluctuations in the delay cells of the master delay line 120 because the bias voltages are common for the slave delay line 140 and the master delay line 120. At least some of the solutions illustrated herein throughout the various Figures minimize this bias voltage deviation due to parasitic capacitance of the delay cells.

FIG. 3B is a graph illustrating fluctuations in bias nodes of the delay cell due to capacitive coupling according to some embodiments. It can be observed that peaks in voltage of the Vccd (associated with the set of pFETs) and of the Vssd (associated with the set of nFETs) of the delay cell 300 occur at the bias voltage node pb after the bias voltage node na and at the bias voltage node pa after the bias voltage node nb, to the inverter behavior of the delay cell 300.

Figure 4:
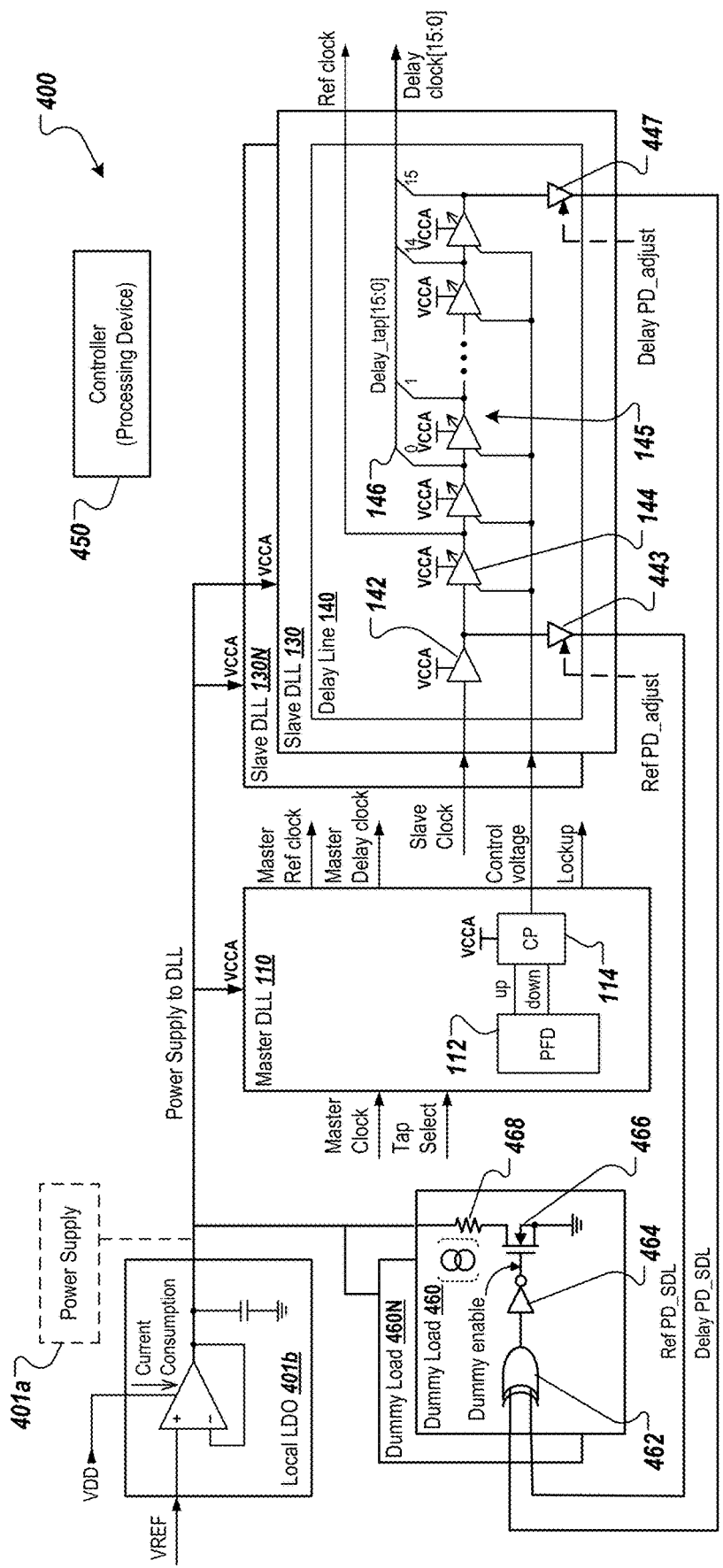
FIG. 4 is a schematic block diagram of a DLL system that employs a dummy load according to at least some embodiments.

FIG. 4 is a schematic block diagram of a DLL system 400 that employs a dummy load 460 according to at least some embodiments, e.g., to minimize the supply voltage deviation that was discussed previously. In some embodiments, the DLL system 400 is a variation to the DLL system 100, and thus only the changes to the DLL system 100 are labeled and discussed in detail. Although any power supply 401a can be employed, illustrated as one possible power supply is a low-dropout regulator (LDO) 401b.

In at least some embodiments, the DLL system 400 further includes one or more dummy loads 460 to 460N coupled between the slave delay line 140 and the output of the power supply 401a or the LDO 401b. In one embodiment, the dummy load 460 includes an exclusive OR (XOR) gate 462 that receives, as inputs, a first output of the buffer 142, which is labeled as "Ref PD_SDL" and the delay clock that is output from the series of delay cells 145, which is labeled as "delay PD_SDL." The dummy load 460 can further include a first transistor 466, an inverter 464 coupled between an output of the XOR gate 462 and a gate of the first transistor 466, and a first resistor 468 coupled between a drain of the first transistor 466b and the output of the power supply 401a or the LDO 401b. In these embodiments, the slave clock input to the delay line 140 of the slave DLL 130 causes the dummy load 460 to be enabled when the slave DLL 130 consumes current from the current supply, which is illustrated in more detail with reference to FIG. 5.

With continued reference to FIG. 4, the slave delay line 140 can further include a first buffer 443 to buffer the first output (Ref PD_SDL) from the buffer 142 and a second buffer 447 to buffer the delay clock (Delay PD_SDL). In at least some embodiments, the first buffer 443 is a first delay-adjust buffer coupled between the first output and the XOR gate 462 and the second buffer 447 is a second delay-adjust buffer coupled between the delay clock and the XOR gate 462. In these embodiments, the DLL system 400 further includes a controller 450 (e.g., processing device) coupled to the first delay-adjust buffer and the second delay-adjust buffer. The processing device can be configured to supply a first delay-adjust signal ("Ref PD_adjust) to the first delay-adjust buffer to fine tune timing of the first output from the buffer 142 and to supply a second-delay signal ("Delay PD_adjust") to the second delay-adjust buffer to fine tune timing of the delay clock.

Figure 5:
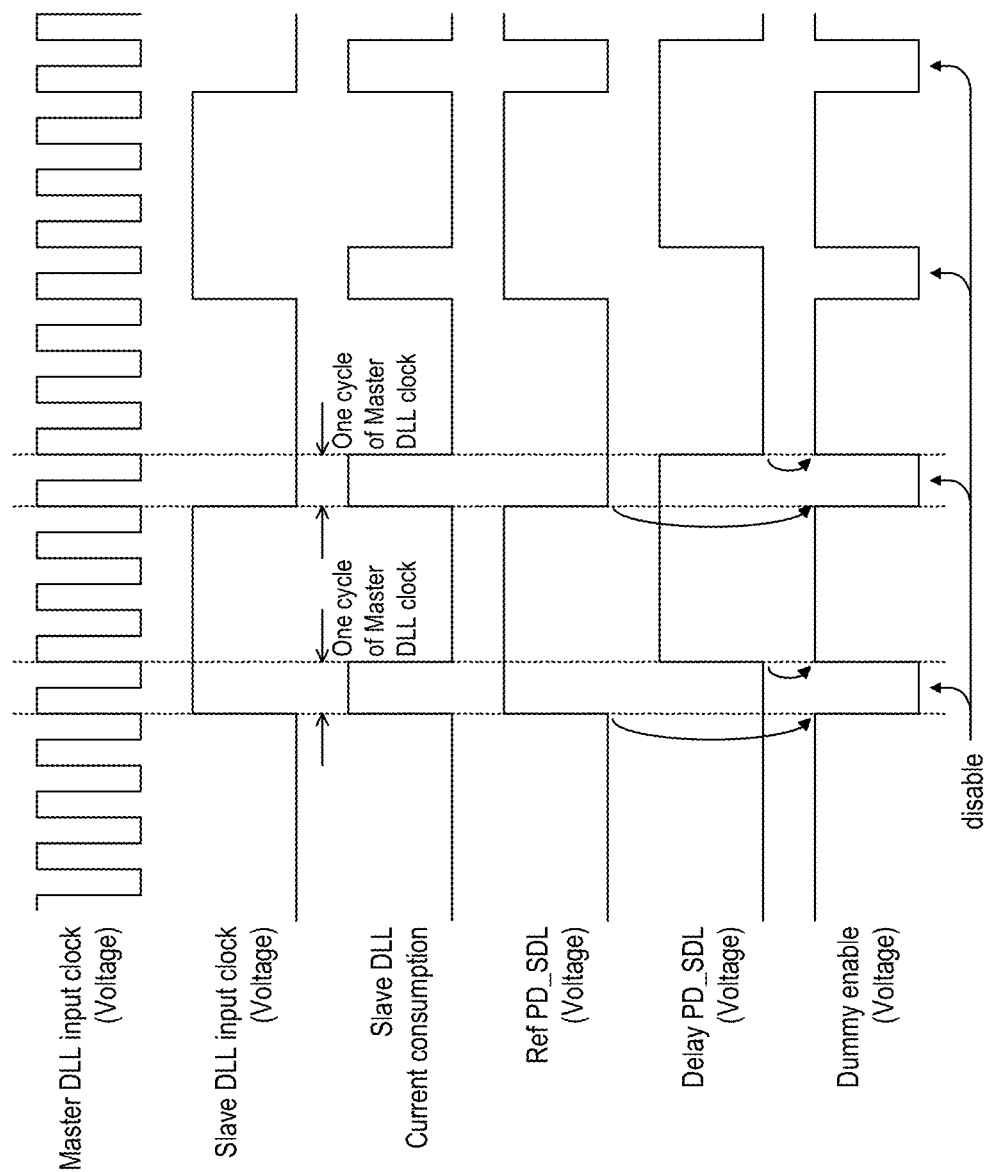
FIG. 5 is a set of graphs illustrating operating of the DLL system of FIG. 4 according to at least some embodiments.

FIG. 5 is a set of graphs illustrating operating of the DLL system of FIG. 4 according to at least some embodiments, namely, from top to bottom, waveforms for the master DLL input clock, the slave DLL input clock, a slave DLL current consumption, the Ref PD_SDL, the Delay PD_SDL, and the dummy load enable signal at the output of the inverter 464. In these embodiments, the dummy load 160 is enabled when the slave DLL 130 is not consuming current from the power supply 401a or the LDO 401b. The dummy load enable signal is generated from the exclusive OR combination of the Ref PD_SDL and Delay PD_SDL signals (from the slave delay line 140), as inverted by the inverter 464.

Thus, in these embodiments, the dummy enable signal is enabled except for, in this example, during the eighth of the master DLL clock cycle when the slave DLL 130 consumes current. In other embodiments where the slave DLL 130 consumes current from the power supply for a greater percentage of the master DLL clock cycle, the dummy load enable signal will be disabled for a longer period of time. In other words, the slave clock, via the first output and the delay clock from the slave delay line 140, causes the dummy load to be disabled when the slave DLL 130 consumes current from the power supply 401a or the LDO 401b.

Figure 6:
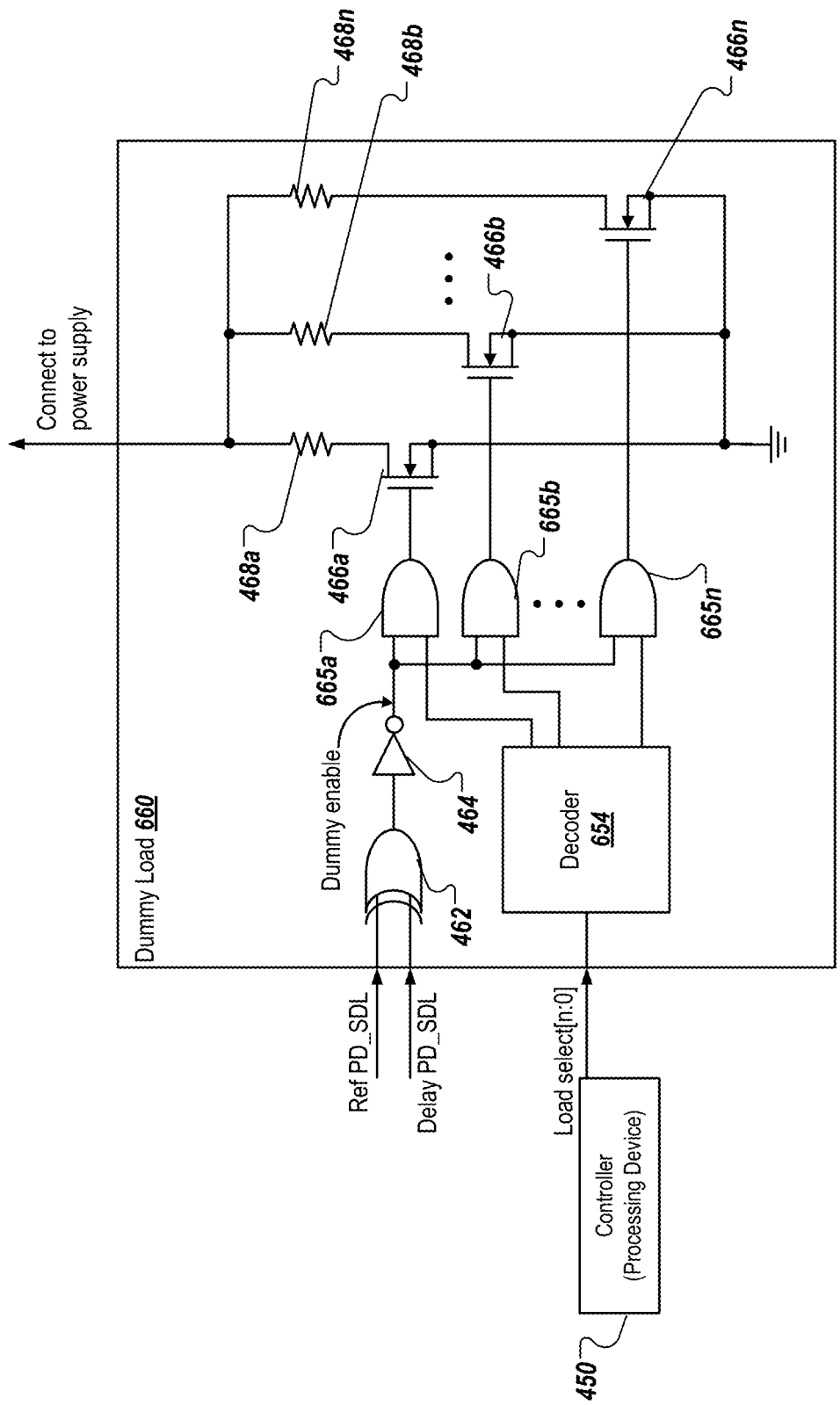
FIG. 6 is a schematic block diagram illustrating a dummy load according to at least one other embodiment.

FIG. 6 is a schematic block diagram illustrating a dummy load 660 according to at least one other embodiment. In one embodiment, the dummy load 660 replaces or is an extension to the dummy load 460 of FIG. 4, and thus components of the dummy load 460 also in the dummy load 660 are identically or similarly numbered. In these embodiments, the dummy load 660 includes a decoder 654 to decode a load select signal (load_select[n:0]) and an array of AND gates 665a to 665n, where each AND gate receives, as inputs, an output of the inverter 464 and one of multiple outputs from the decoder 654. The dummy load 660 can further include an array of transistors 466a to 466n, including the first transistor 466 (e.g., where 466 is 466a), having gates controlled by one of multiple outputs from respective AND gates of the array of AND gates 665a to 665n. The dummy load 660 can further include an array of resistors 468a to 468n, including the first resistor 468 (e.g., where 468 is 468a), where a respective resistor of the array of resistors 468a to 468n is coupled between a drain of each transistor of the array of transistors 466a to 466n and the power supply 401a or LDO 401b.

In at least some embodiments, each respective resistor of the array of resistors 468a to 468n has a different resistance. In these embodiments, the controller 450 can send the load select signal to the decoder 654 to select which resistance, corresponding to one of the array of resistors 468a to 468n, such that the current consumption of the dummy load 660 matches the current consumption of the slave DLL 130. Thus, even if additional changes are made to the slave DLL 130 design, no structural change need be made to the dummy load 460, whose resistance is variably selectable by the controller 450.

Figure 7:
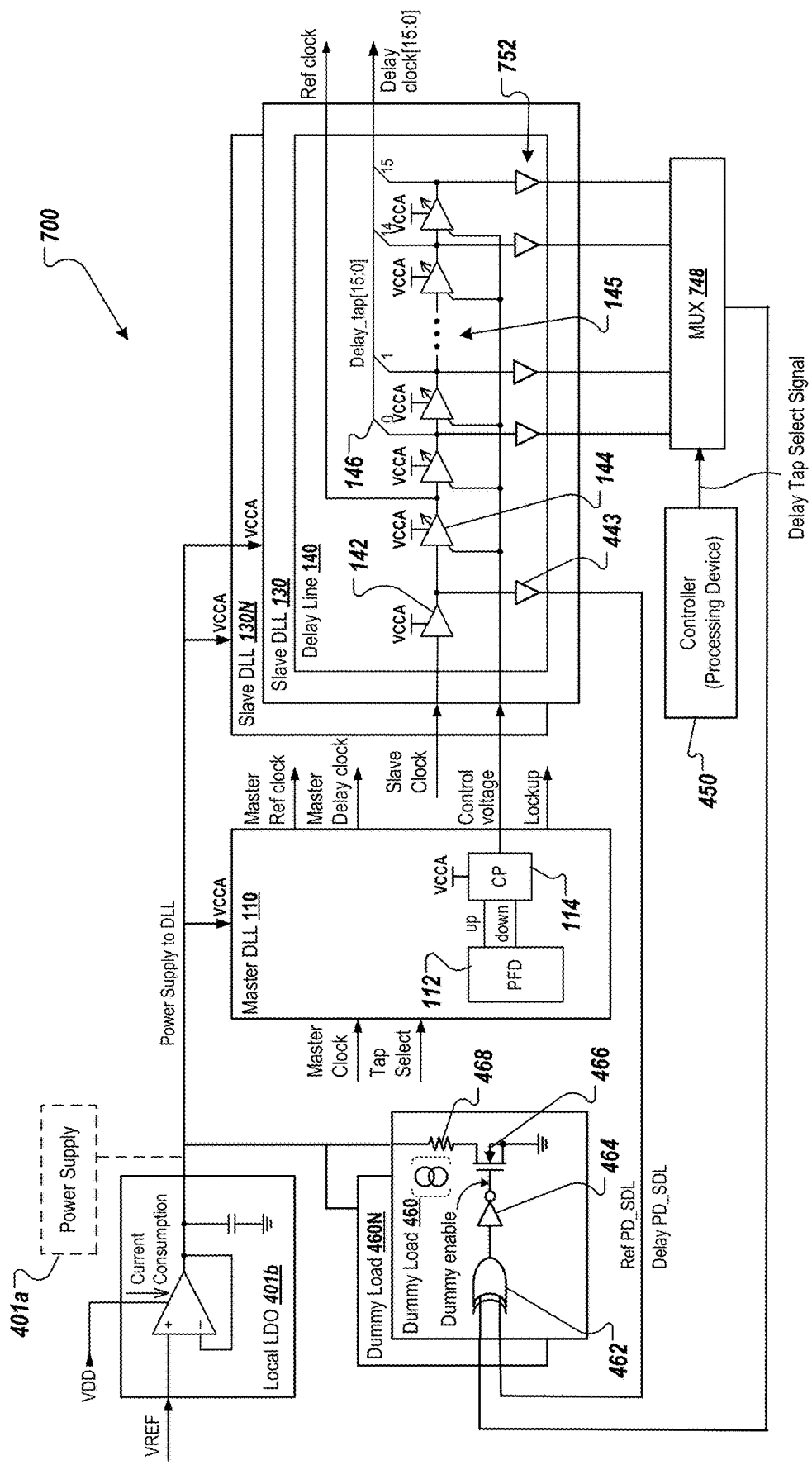
FIG. 7 is a schematic block diagram of a DLL system that further includes a delay tap selector according to at least one embodiment.

FIG. 7 is a schematic block diagram of a DLL system 700 that further includes a delay tap selector according to at least one embodiment. In some embodiments, the DLL system 700 is an extension to the DLL system 400 of FIG. 4, and thus, the same components are identically labeled and are not reintroduced. In these embodiments, the DLL system 700 further incudes a multiplexer 748 that receives, as inputs, an output of each delay cell of the series of delay cells 145, and is to output the delay clock, which can therefore be of a different phase at each tap output from the slave delay line 146. In these embodiments, the slave delay line 140 further includes a series of buffers 752, where each respective buffer of the series of buffer 752 outputs a respective delay clock of different phase corresponding to each respective tap output. Further, in these embodiments, the controller 450 (e.g., processing device) is coupled to the multiplexer 748, the processing device to generate a delay tap select signal that causes the multiplexer to select an output of one of the series of delay cells. In this way, the controller 450 can fine-adjust the enable and disable timing of the one or more dummy loads 460 to 460n.

Figure 8A:
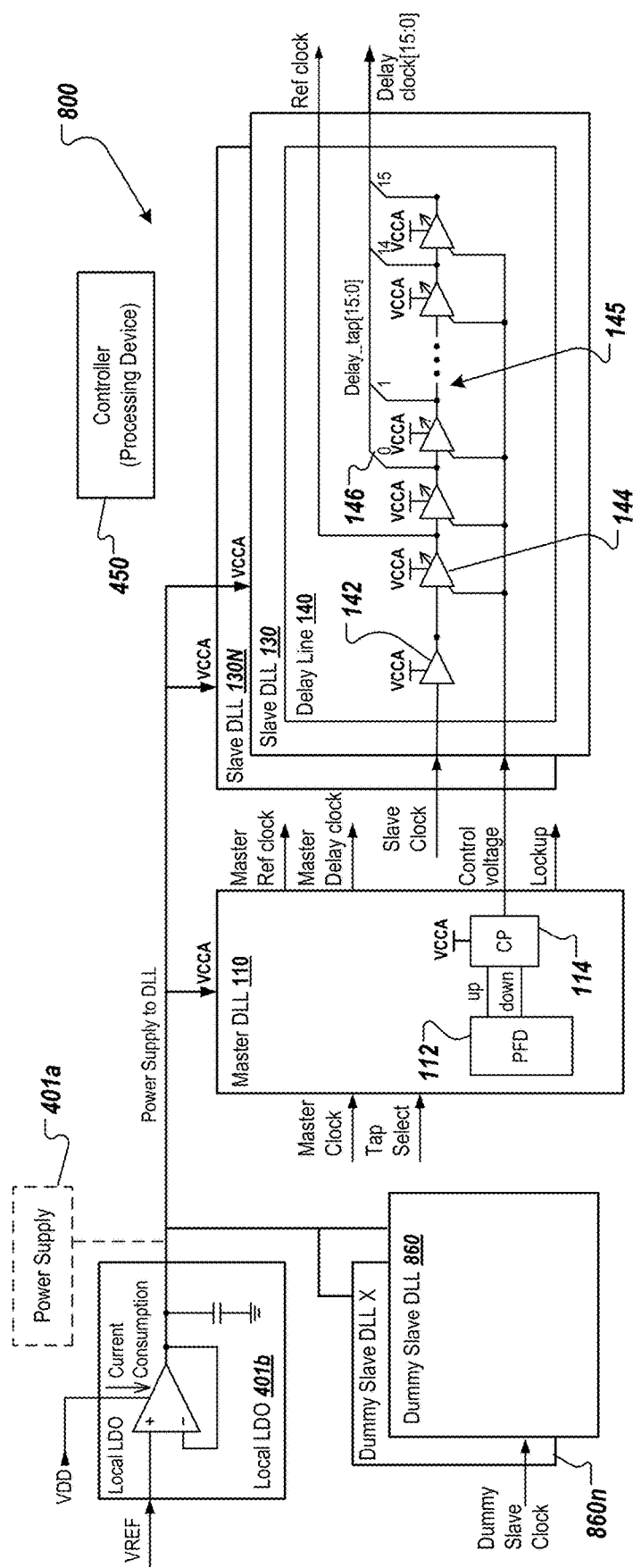
FIG. 8A is a schematic block diagram of a DLL system that employs one or more dummy slave DLLs according to at least some embodiments.

FIG. 8A is a schematic block diagram of a DLL system 800 or DLL apparatus that employs one or more dummy slave DLLs 860 to 860n according to at least some embodiments. In these embodiments, the dummy slave DLL 860 can be employed instead of a dummy load. In these embodiments, the dummy slave DLL 860 is designed the same as or identical to the slave DLL 130. Further, the controller 450 causes a dummy slave clock to be input into the dummy slave DLL 860 when the slave clock is not input into the slave DLL 130.

Figure 8B:
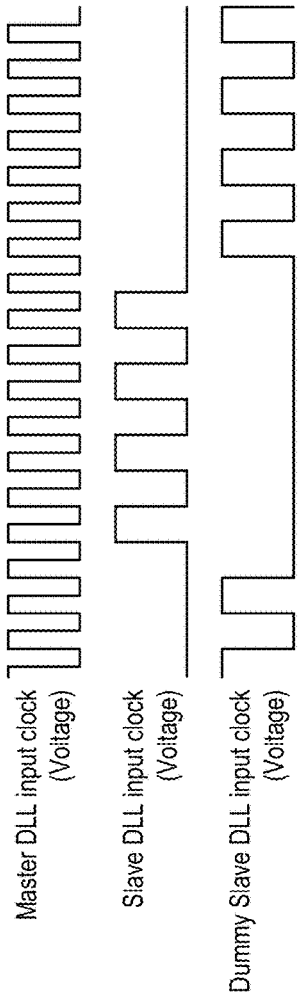
FIG. 8B is a set of graphs that illustrate operation of the DLL system of FIG. 8A according to at least one embodiment.

FIG. 8B is a set of graphs that illustrate operation of the DLL system 800 of FIG. 8A according to at least one embodiment. As discussed, when the slave DLL input clock is not enabled, the controller 450 can enable the dummy slave clock of the dummy slave DLL 860, where the frequency of both the slave DLL input clock and the dummy slave input clock are identical, as illustrated in the bottom two graphs. This solution to supply voltage variation may work stably for a pressure, voltage, temperature conditions due to the replicated hardware. Thus, the tradeoff for stable, reliable operation in terms of timing of elimination of power supply variation is the extra circuit area of the dummy slave DLL 860 within the DLL system 800.

In at least one embodiment, the DLL system 800 includes the master DLL 100 including the phase frequency detector 112 connected in series with the charge pump 114, which generates a control voltage. The DLL system 800 further includes a slave DLL 130 coupled to the master DLL 110 and that includes a delay line, e.g., the slave delay line 140. The delay line is controlled by the control voltage, is to selectively receive the slave clock, and is to selectively output the delay clock. The DLL system 800 further includes the power supply 401a or LDO 401b, which experiences one of undershoot or overshoot in response to a load transient, to power the master DLL 110 and the slave DLL 130. The DLL system 800 further includes the dummy slave DLL 860 that is identical to the slave DLL 130 and is to selectively receive a dummy slave clock. In these embodiments, an output of the dummy slave DLL 860 is connected to an output of the power supply 401a or the LDO 401b. The DLL system 800 can further include the controller 450, e.g., a processing device, operatively coupled to the slave clock and the dummy slave clock. According to this at least one embodiment, the processing device causes the dummy slave clock to be input to the dummy slave DLL only when the slave clock is not input to the slave DLL.

Figure 9A:
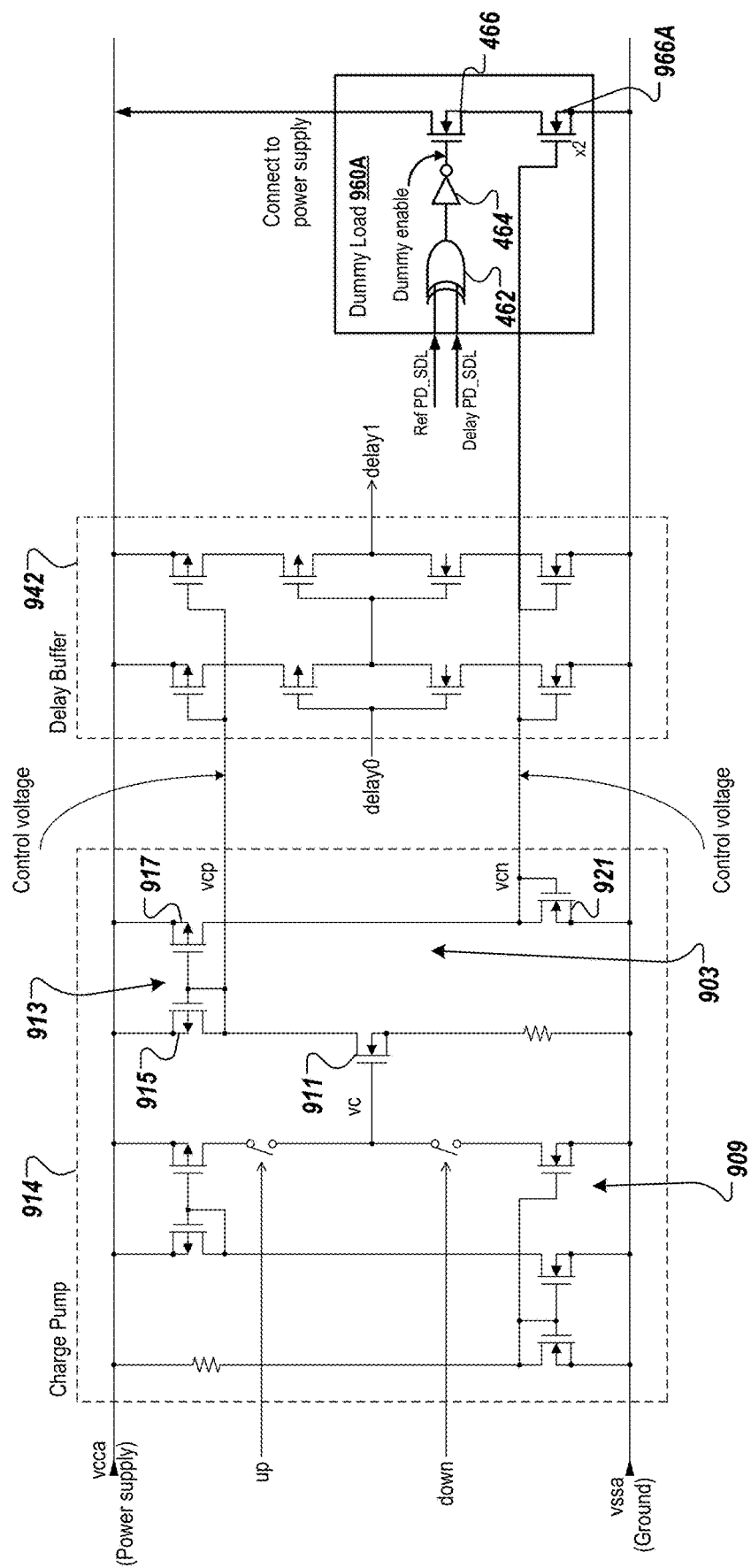
FIG. 9A is a schematic block diagram illustrating current mirror circuitry of the charge pump to generate a control voltage sent to a dummy load according to at least one embodiment.

FIG. 9A is a schematic block diagram illustrating current mirror circuitry 903 of a charge pump 914 to generate a control voltage sent to a dummy load 960A according to at least one embodiment. In at least some embodiments, the charge pump 914 is the charge pump 114 of previous DLL systems discussed herein. In these embodiments, the charge pump 914 is connected to a delay buffer 942, such as the buffer 142 of the slave delay line 140 of the slave DLL 130 previously discussed herein, and is coupled to the dummy load 960A via the control voltage that was previously discussed.

In these embodiments, the dummy load 960A includes a first transistor 466 that is selectively enabled by the delay line, e.g., the slave delay line 140, the exclusive OR (XOR) gate 462, that receives, as inputs, a first output of the buffer and the delay clock of the slave delay line 140, and the inverter 464 coupled between an output of the XOR gate 462 and a gate of the first transistor 466. The dummy load 960A can further include one or more second transistors 966A selectively connected in series with the first transistor 466 and selectively enabled by the control voltage. More specifically, the one or more second transistors 966A receive the control voltage at gates of the one or more transistors 966A and have sources connected to ground. In some embodiments, the one or more second transistors 966A include a bank of transistors that are selectively connected to achieve a particular resistance.

In at least these embodiments, the charge pump 914 includes front-end circuitry 909 adapted to receive the up and down signals from the phase frequency detector 112, which at any given time provide a voltage control signal (Vc) to a transistor switch 911. The charge pump 914 can further include the current mirror 903 that generates the control voltage at an output of the current mirror 903 and a bias current circuit 913 that is a part of the current mirror 903. The bias current circuit 913 is biased by the phase frequency detector 112, e.g., via control of the transistor switch 911.

In at least one embodiment, the bias current circuit 913 of the current mirror circuitry 903 includes a pair of mutually-connected p-type field-effect transistors (FETs) including a first pFET 915 and a second pFET 917, where gates of the first pFET 915 and the second pFET 917 are selectively connected to the phase frequency detector 112, e.g., through the transistor switch 911. The current mirror circuitry 903 further includes an n-type FET (nFET) 921 having a drain connected to a drain of the second pFET 917, where the drain of the nFET 921 is connected to a gate of the nFET 921 and is to generate the control voltage, which is sent to the delay buffer 942 and the dummy load 960A. In these embodiments, sources of the first pFET 915 and the second pFET 917 are coupled to the power supply, and a source of the nFET 921 is coupled to ground.

Figure 9B:
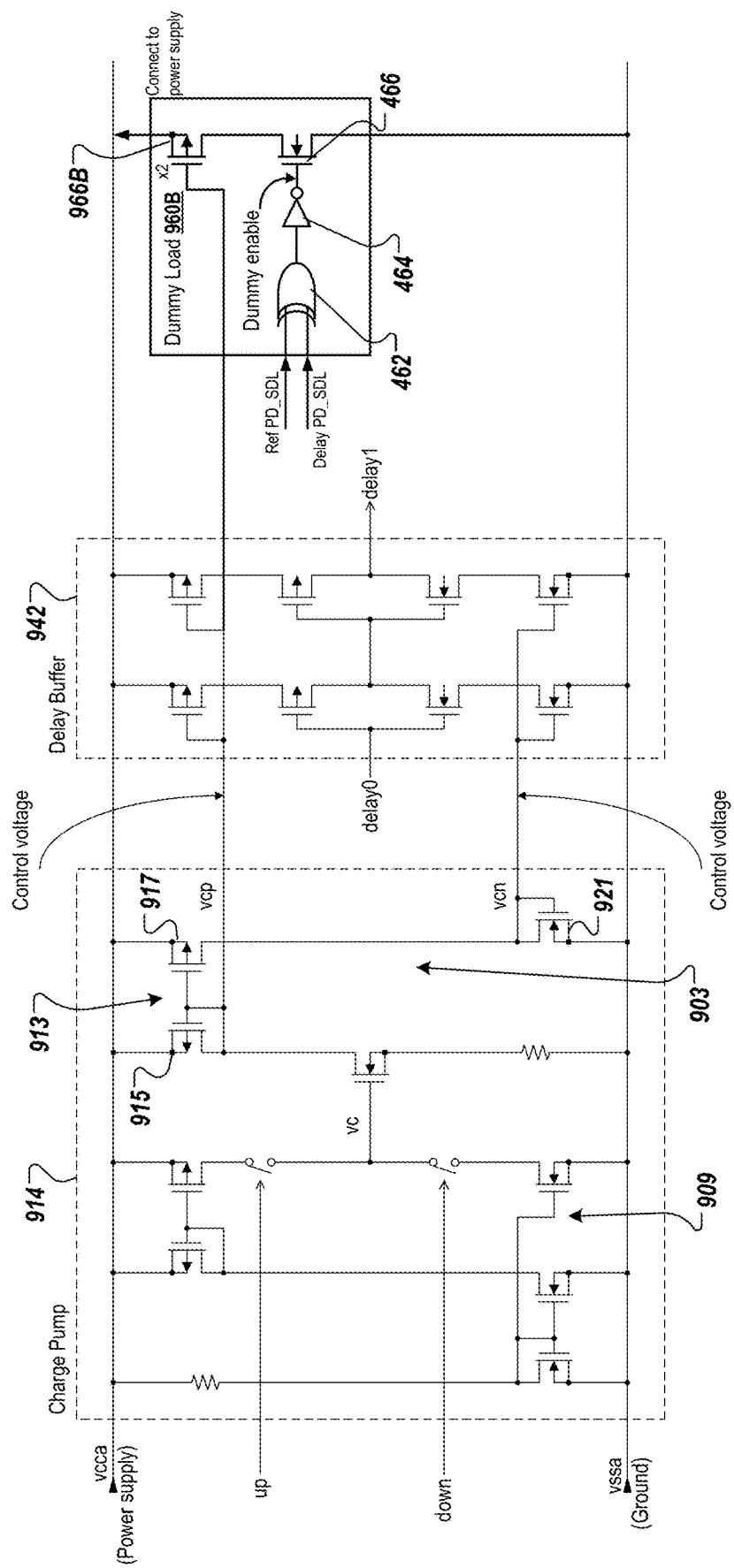
FIG. 9B is a schematic block diagram illustrating current mirror circuitry of the charge pump to generate a control voltage sent to a dummy load according to at least one alternative embodiment.

FIG. 9B is a schematic block diagram illustrating the current mirror circuitry 903 of the charge pump 914 to generate the control voltage sent to a dummy load 960B according to at least one alternative embodiment. Different than the embodiment of FIG. 9A, the embodiment of FIG. 9B shifts the control voltage to being generated from the bias current circuit 913 directly. For example, gates of the first pFET 915 and the second pFET 917 may be selectively connected to the phase frequency detector 112 and that generate the control voltage that is sent to the delay buffer 942 and to the dummy load 960B. Further, the dummy load 960B includes one or more second transistors 966B selectively connected in series with the first transistor 466, have gates coupled to the control voltage, and have sources that are connected to the power supply, e.g., the power supply 401a or the LDO 401b. In some embodiments, the one or more second transistors 966B include a bank of transistors that are selectively connected to achieve a particular resistance.

Figure 10:
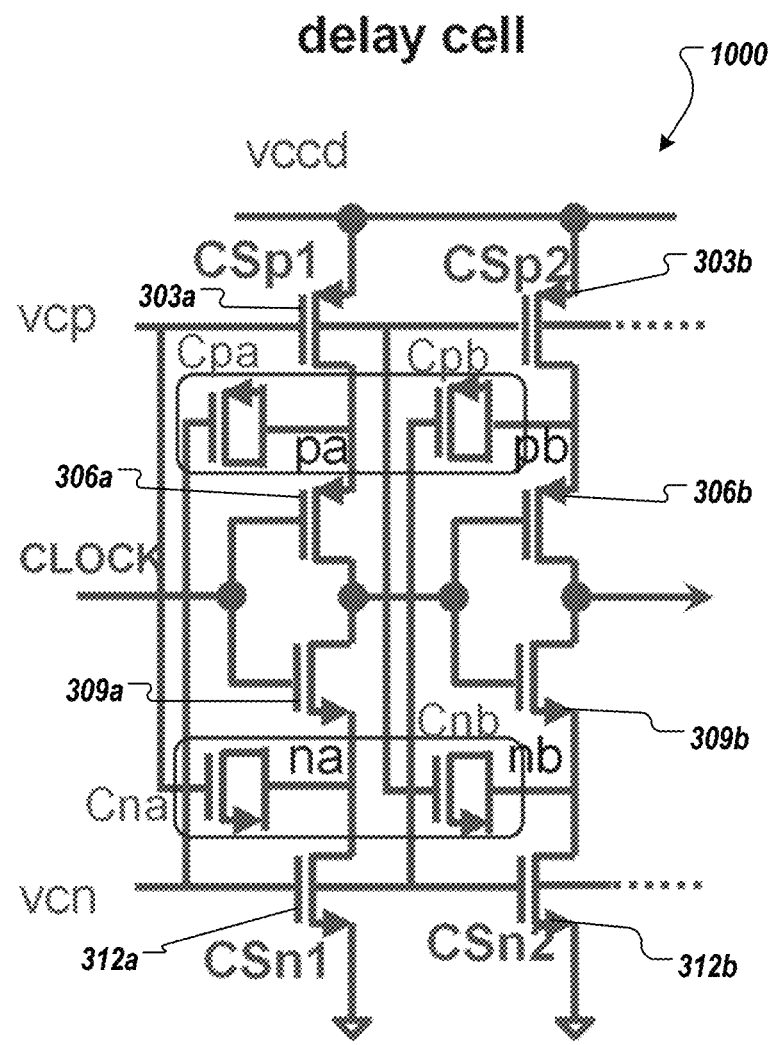
FIG. 10 illustrates circuitry of a delay cell that employs dummy transistors as capacitors to cancel direct-voltage (DC) fluctuation of a bias voltage according to at least one embodiment.

FIG. 10 illustrates circuitry of a delay cell 1000 that employs dummy transistors as capacitors to cancel direct-voltage (DC) fluctuation of a bias voltage according to at least one embodiment. More specifically, as an extension to the delay cell 300 discussed with reference to FIG. 3A, the delay cell 1000 adds a set of dummy transistors Cpa, Cpb, Cna, Cnb, which function as capacitors which are the same type of current source as the set of pFETs and the set of nFETs of the delay cell 300. The dummy transistors Cpa, Cpb, Cna, Cnb can operate as capacitors by combining source and drain of each dummy transistor as a first terminal and connect a gate of each transistor as a second terminal, and where dummy transistors Cpa and Cpb are pFETs and transistors Cna and Cnb are nFETs. The transistors Cpa, Cpb, Cna, Cnb can also be MOSFETs or a different type of transistor, but are illustrated as FETs for simplicity of explanation.

In at least some embodiments, transistor Cpa is connected between the drain of the first pFET 303a (e.g., at the pa node) to the negative control voltage (Vcn) and the transistor Cpb is connected between the drain of the second pFET 303b (e.g., at the pb node) and Vcn to cancel DC voltage fluctuation of bias voltage at the pa and pb nodes. In these embodiments, transistor Cna is connected between the source of the first nFET 309a and the positive control voltage (Vcp) and transistor Cnb is connected between the source of the second nFET 309b and to Vcp to cancel DC voltage fluctuation of bias voltage at the na and nb nodes.

In these embodiments, for example, feeding the na node voltage swing to Vcp through transistor Cna cancels the noise through parasitic gate-drain (Cgd) of the first pFET 303a and the fourth pFET 306a from the pa node, and so forth, similarly for the nb node. Further, for example, feeding the pa node voltage swing to Vcn through transistor Cpa cancels the noise through parasitic gate-drain of the first nFET 309a and the fourth nFET 312a from the na node, and so forth, similarly for the pb node.

In various embodiments, each of the dummy transistors Cpa, Cpb, Cna, Cnb are sized about half the of the other FETs, whether pFETs or nFETs, respectively, because the parasitic Cgd of each of the set of pFETs and each of the set of nFETs would be equal to the parasitic Cgd plus the Cgs of a dummy transistor if the voltage swing of the na or nb node equals the voltage swing of the pa or pb node, respectively. Thus, adjusting the size of the dummy transistors Cpa, Cpb, Cna, Cnb according to the pulse amplitude of the voltage at the pa node, e.g., to be equal to the voltage at the pb node, and of the voltage and the na node, e.g., to be equal to the voltage at the nb node may be performed to most effectively cancel out the noise through the parasitic capacitances.

Figure 11B:
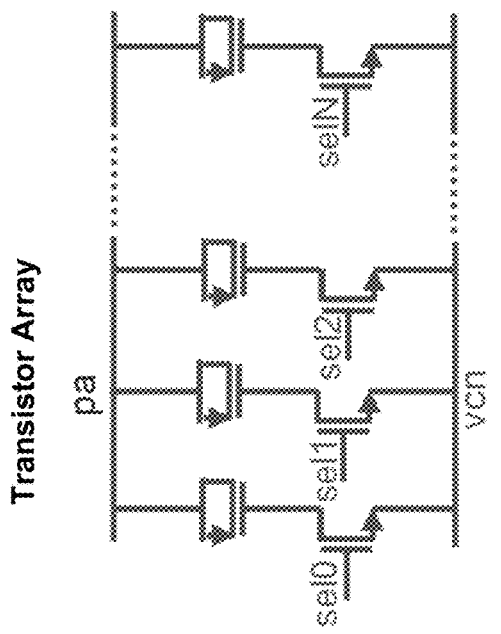
FIG. 11B illustrates a transistor array that provides the variable capacitance selection capability of FIG. 11A according to one embodiment.
Figure 11A:
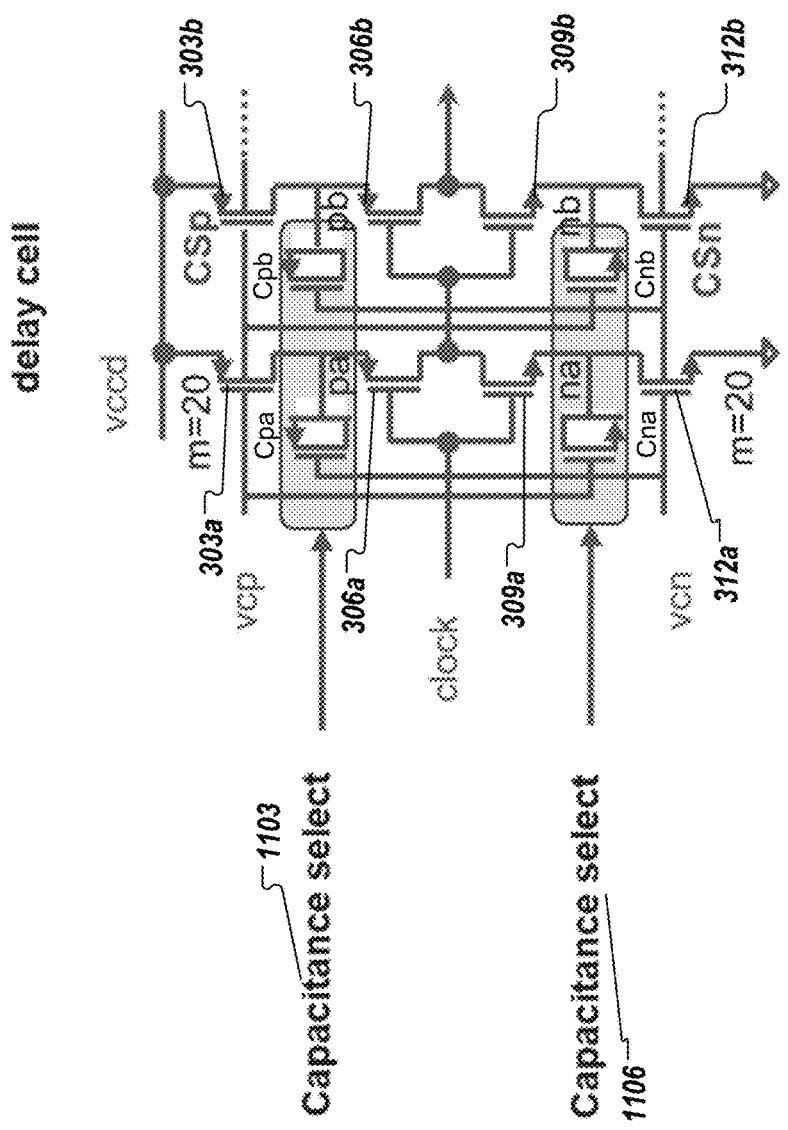
FIG. 11A illustrates circuitry that provides variable capacitance selection capability of the circuitry of FIG. 10 according to at least one embodiment.

FIG. 11A illustrates circuitry that provides variable capacitance selection capability of the circuitry of FIG. 10 according to at least one embodiment. In these embodiments, the dummy transistors Cpa and Cpb can each be a transistor array, e.g., of p-type transistors and the dummy transistor Can and Cnb can be a transistor array, e.g., of n-type transistors. FIG. 11B illustrates a transistor array that provides the variable capacitance selection capability to transistor Cpa just by way of example.

In these embodiments, the controller 450 provides a capacitance selection signal 1103 to select one or more of the first dummy transistors of a first transistor array for dummy transistor Cpa and to select one or more second dummy transistors of a second transistor array for dummy transistor Cpb. Further, the controller 450 can provide a capacitance selection signal 1106 to select one or more third dummy transistors of a third transistor array for dummy transistor Cna and to select one or more fourth dummy transistors from a fourth transistor array for dummy transistor Cnb.

Figure 12:
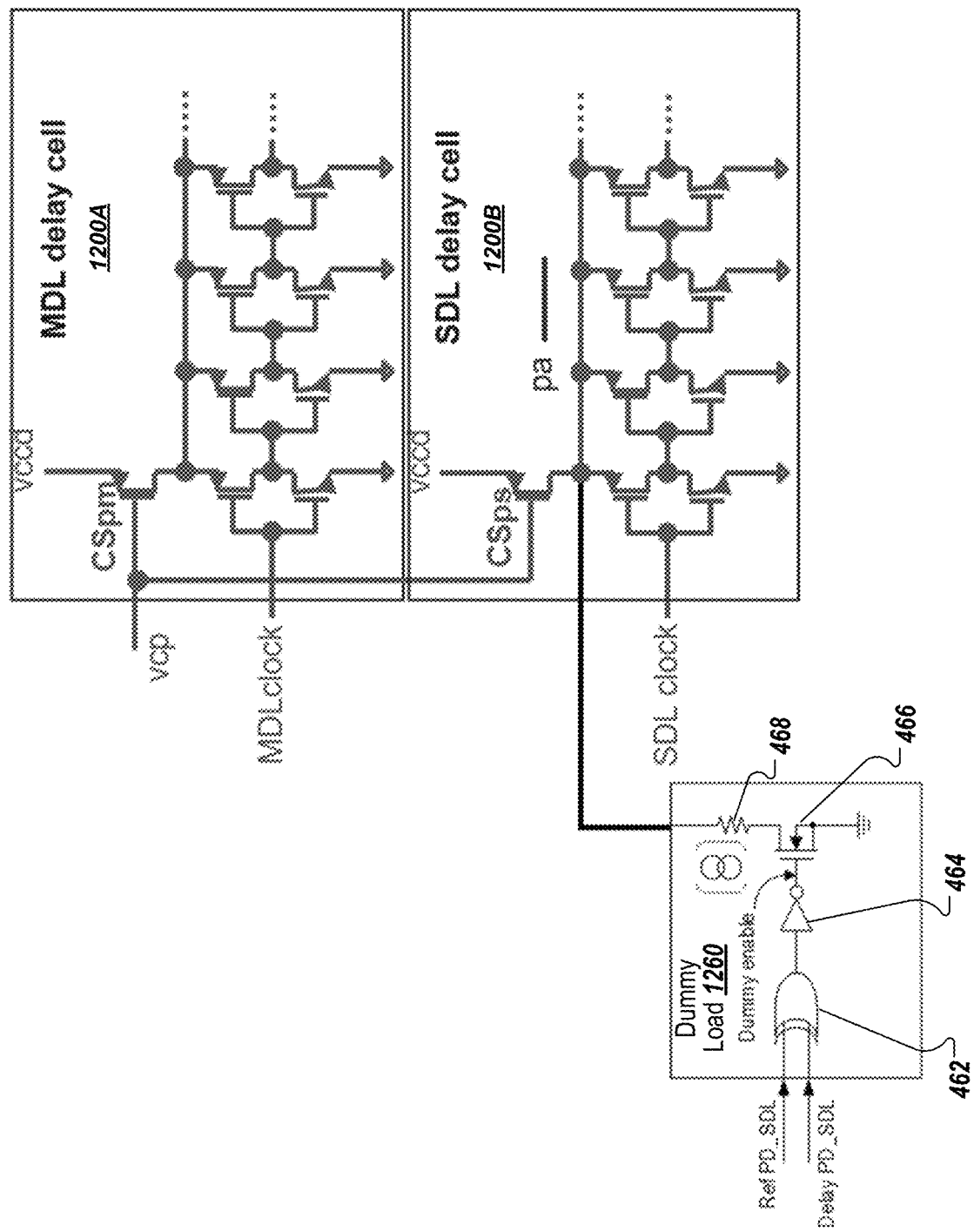
FIG. 12 is a schematic block diagram that includes a dummy load employed to provide a bias voltage to one or more inverters of a slave delay lay according to at least some embodiments.

FIG. 12 is a schematic block diagram that includes a dummy load 1260 employed to provide a bias voltage to one or more inverters of a slave delay cell according to at least some embodiments. In these embodiments, delay cells for the master delay line 120 and for the slave delay line 140 are each varied, as illustrated. For example, an MDL delay cell 1200A includes a first pFET coupled between a power supply and a first series of mutually-coupled pFETs and nFETs, which instantiate a first series of inverters controlled by the master clock (MDL clock). Further, an SDL delay cell 1200B includes a second pFET coupled between the power supply and a second series of mutually-coupled pFETs and nFETs, which instantiate a second series of inverters controlled by the slave clock (SDL clock). The positive control voltage (Vcp) can enable both of the first pFET and the second pFET while the dummy load 1260 can be used to bias the drain of the second pFET and the sources of the pFETs of the second series of mutually-coupled pFETs. In some embodiments, the dummy load is the dummy load 460 of FIG. 4 or FIG. 7.

In these embodiments, the Vcp bias voltage controls the delay of inverters. When the slave clock arrives at the slave DLL 130, a pa node voltage drops due to the inverter current and then settles to the target voltage, where the initial voltage is higher than the target voltage. this causes slave DLL delay fluctuation. Employing the dummy load 1260 to provide a bias voltage in the delay cells of the slave delay line 140 makes the load current constant, e.g., so that delay fluctuation can be eliminated.

In the above description, some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "communicating," "modifying," "measuring," "determining," "detecting," "sending," "comparing," "maintaining," "switching," "controlling," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A device comprising:
   a master delay-lock loop (DLL) comprising a phase frequency detector connected in series with a charge pump, the charge pump to generate a control voltage;
   a slave DLL coupled to the master DLL and including a delay line comprising:
   a buffer to receive a slave clock; and
   a series of delay cells coupled between the buffer and an output terminal that is to output a delay clock, the series of delay cells variably controlled by the control voltage;
   wherein each of the master DLL and the slave DLL is powered by a power supply that experiences one of undershoot or overshoot in response to a load transient; and
   a dummy load coupled between the delay line of the slave DLL and an output of the power supply, the dummy load comprising an exclusive OR (XOR) gate that receives, as inputs, a first output of the buffer and the delay clock.

2. The device of claim 1, wherein the slave clock, via the first output and the delay clock from the delay line, is to cause the dummy load to be disabled when the slave DLL consumes current from the power supply.

3. The device of claim 1, wherein the power supply is a low-dropout regulator (LDO).

4. The device of claim 1, wherein the dummy load further comprises:
   a first transistor;
   an inverter coupled between an output of the XOR gate and a gate of the first transistor; and
   a first resistor coupled between a drain of the first transistor and the output of the power supply.

5. The device of claim 4, wherein the dummy load further comprises:
   a decoder to decode a load select signal;
   an array of AND gates, wherein each AND gate receives, as inputs, an output of the inverter and one of multiple outputs from the decoder;
   an array of transistors, including the first transistor, having gates controlled by one of multiple outputs from respective AND gates of the array of AND gates; and
   an array of resistors, including the first resistor, wherein a respective resistor of the array of resistors is coupled between a drain of each transistor of the array of transistors and the power supply, wherein each respective resistor of the array of resistors has a different resistance.

6. The device of claim 1, wherein the delay line of the slave DLL further comprises a dummy delay buffer connected in series between the buffer and the series of delay cells.

7. The device of claim 1, further comprising:
   a multiplexer that receives, as inputs, an output of each delay cell of the series of delay cells, and is to output the delay clock; and
   a processing device coupled to the multiplexer, the processing device to generate a delay tap select signal that causes the multiplexer to select an output of one of the series of delay cells.

8. The device of claim 1, further comprising:
   a first delay-adjust buffer coupled between the first output and the XOR gate;
   a second delay-adjust buffer coupled between the delay clock and the XOR gate; and
   a processing device coupled to the first delay-adjust buffer and the second delay-adjust buffer, the processing device to:
   supply a first delay-adjust signal to the first delay-adjust buffer to fine tune timing of the first output; and
   supply a second-delay signal to the second delay-adjust buffer to fine tune timing of the delay clock.

9. A system comprising:
   a master delay-lock loop (DLL) comprising:
   a charge pump to generate a control voltage;
   a first series of delay cells to receive a master clock, the first series of delay cells variably controlled by the control voltage; and
   a phase frequency detector connected to an input of the charge pump;
   a slave DLL coupled to the master DLL and including a delay line, wherein each of the master DLL and the slave DLL is powered by a power supply that experiences one of undershoot or overshoot in response to a load transient;

a dummy load coupled between the delay line of the slave DLL and an output of the power supply, the dummy load comprising:
 a first transistor that is selectively enabled by the delay line; and
 one or more second transistors selectively connected in series with the first transistor and selectively enabled by the control voltage; and
wherein the charge pump comprises:
 a current mirror circuitry that generates the control voltage at an output of the current mirror circuitry; and
 a bias current circuit that is a part of the current mirror circuitry and is biased by the phase frequency detector.

10. The system of claim 9, further comprising the power supply, wherein the power supply is a low-dropout regulator (LDO).

11. The system of claim 9, wherein the delay line of the slave DLL comprises:
 a buffer to receive a slave clock; and
 a second series of delay cells coupled between the buffer and an output terminal that is to output a delay clock, the second series of delay cells also variably controlled by the control voltage.

12. The system of claim 11, wherein the slave clock is to cause the dummy load to be disabled when the slave DLL consumes current from the power supply.

13. The system of claim 11, further comprising:
 a multiplexer that receives, as inputs, an output of each delay cell of the second series of delay cells, and is to output the delay clock; and
 a processing device coupled to the multiplexer, the processing device to generate a delay tap select signal that causes the multiplexer to select an output of one of the second series of delay cells.

14. The system of claim 11, wherein the dummy load further comprises:
 an exclusive OR (XOR) gate, that receives, as inputs, a first output of the buffer and the delay clock;
 an inverter coupled between an output of the XOR gate and a gate of the first transistor; and
 a resistor coupled between a drain of the first transistor and the output of the power supply.

15. The system of claim 9, wherein the current mirror circuitry of the charge pump comprises:
 a pair of mutually-connected p-type field-effect transistors (FETs) comprising a first pFET and a second pFET, wherein gates of the first pFET and the second pFET are selectively connected to the phase frequency detector; and
 an n-type FET (nFET) having a drain connected to a drain of the second pFET, wherein the drain of the nFET is connected to a gate of the nFET and is to generate the control voltage.

16. The system of claim 15, wherein sources of the first pFET and the second pFET are coupled to the power supply, and a source of the nFET is coupled to ground.

17. The system of claim 9, wherein the current mirror circuitry of the charge pump comprises:
 a pair of mutually-connected p-type FETs comprising a first pFET and a second pFET, wherein gates of the first pFET and the second pFET are selectively connected to the phase frequency detector and is to generate the control voltage; and
 an n-type FET (nFET) having a drain connected to a drain of the second pFET.

18. The system of claim 17, wherein sources of the first pFET and the second pFET are coupled to the power supply, and a source of the nFET is coupled to ground.

19. An apparatus comprising:
 a master delay-lock loop (DLL) comprising a phase frequency detector connected in series with a charge pump, the charge pump to generate a control voltage;
 a slave DLL coupled to the master DLL and including a delay line, wherein the delay line is controlled by the control voltage, is to selectively receive a slave clock, and is to selectively output a delay clock;
 a power supply, which experiences one of undershoot or overshoot in response to a load transient, to power the master DLL and the slave DLL;
 a dummy slave DLL that is identical to the slave DLL and is to selectively receive a dummy slave clock, wherein an output of the dummy slave DLL is connected to an output of the power supply; and
 a processing device operatively coupled to the slave clock and the dummy slave clock, wherein the processing device is to cause the dummy slave clock to be input to the dummy slave DLL only when the slave clock is not input to the slave DLL.

20. The apparatus of claim 19, wherein the power supply is a low-dropout regulator (LDO).

* * * * *